US005400050A

United States Patent [19]

Matsumoto et al.

[11] Patent Number: 5,400,050

[45] Date of Patent: Mar. 21, 1995

[54] DRIVING CIRCUIT FOR USE IN A DISPLAY APPARATUS

[75] Inventors: Toshio Matsumoto, Nara; Osamu Sasaki, Tenri; Yasunobu Akebi, Yamabe; Toshihiro Yamashita, Nara, all of Japan

[73] Assignee: Sharp Kabushiki Kaisha, Osaka, Japan

[21] Appl. No.: 156,306

[22] Filed: Nov. 23, 1993

[30] Foreign Application Priority Data

Nov. 24, 1992 [JP] Japan .................................. 4-313712
Nov. 24, 1992 [JP] Japan .................................. 4-313713

[51] Int. Cl.[6] .............................................. G11C 19/00

[52] U.S. Cl. .................................... 345/100; 345/208; 377/76

[58] Field of Search .................... 377/76; 345/98-100, 345/208

[56] References Cited

U.S. PATENT DOCUMENTS 5,307,085 4/1994 Nakamura ............................ 345/99

FOREIGN PATENT DOCUMENTS 0167408 1/1986 European Pat. Off. .
0298255 1/1989 European Pat. Off. .
402003008 1/1990 Japan .................................. 345/100
402083584 3/1990 Japan .................................. 345/100

*Primary Examiner*—Margaret Rose Wambach
*Attorney, Agent, or Firm*—David G. Conlin; Robert F. O'Connell; Kevin J. Fournier

[57] ABSTRACT

A driving circuit for use in a display apparatus for transmitting a video signal to data lines includes a plurality of shift registers; a control signal generating circuit for outputting a control signal which is at the ON level during a period shorter than a pulse width of signals outputted by the shift registers; a switching circuit controlled to be ON or OFF based on the control signal; and a sampling capacitor for holding the video signal sampled by the switching circuit. In such a driving circuit, the plurality of shift registers sequentially output signals so that the periods in which the signals are high are partially overlapped sequentially. The control signal generating circuit outputs a control signal which is at the On level during a period shorter than the signals from the shift registers. Since the switching circuit is controlled to be ON or OFF based on the control signal, a period in which the switching circuit is conductive is short. Accordingly, the number of such switching circuits which are simultaneously conductive is small, thereby applying a capacitance of only a small number of capacitors to a video signal line.

8 Claims, 14 Drawing Sheets

DRIVING CIRCUIT FOR USE IN A DISPLAY APPARATUS

BACKGROUND OF THE INVENTION

1. Field of the Invention

The present invention relates to a driving circuit for outputting a video signal to a data signal line, the driving circuit being used in a display apparatus such as an active matrix liquid crystal display apparatus or the like.

2. Description of the Related Art

In an active matrix liquid crystal display apparatus, an image is displayed by driving pixels formed in a matrix each by a switching device such as a thin film transistor. A conventional active matrix liquid crystal display apparatus is a driver monolithic display apparatus, in which a display section having pixels and a data signal line driving circuit (hereinafter, referred to as "source driver") for driving the pixels are formed on a single substrate. In the driver monolithic display apparatus, since the switching devices and the source driver are formed in an identical step of production, the switching devices and a device forming the source driver desirably have an identical structure with each other. In a transparent display apparatus, a switching device should be formed on a transparent substrate formed of, for example, silica glass by use of a thin film process, and further a device forming a source driver should have a necessary operating speed. For these reasons, a polysilicon thin film transistor (hereinafter, referred to as "polysilicon TFT") is usually used for both the switching device and the device forming the source driver.

The polysilicon TFT has a mobility of approximately 10 to 100 $cm^2/V.s$. Accordingly, the maximum stable operating speed which has been realized so far in a shift register using such a polysilicon TFT is several megahertz. However, in a display apparatus having a large number of pixels, for example, a NTSC-TV (National Television System Committee television) having 720 horizontal pixels, a shift register forming a source driver should have an operating speed of 14.4MHz. In order to bridge such a difference, a source driver which accommodates the lower operating speed of a shift register is used.

FIG. 12 illustrates a structure of such a source driver. The source driver includes four shift registers 11 to 14, sampling analog switches 21 to 2*n* controlled to be "ON" or "OFF" by the shift registers 11 to 14, a video signal line 30 to which a video signal Video is sent, and sampling capacitors 41 to 4*n* connected to the video signal line 30 through the sampling analog switches 21 to 2*n*. Data signal lines S1 to Sn connected to pixels (not shown) are branched to be connected to the sampling analog switches 21 to 2*n*, and the sampling capacitors 41 to 4*n*. The data signal lines S1 to S*n* are divided into groups each including adjacent four data signal lines (for example, S1, S2, S3 and S4). The four data signal lines of each group are respectively connected to the sampling analog switches connected to the shift registers 11 to 14. Practically, every first data signal line of each group (for example, S1, S5, S9, . . . ) are connected to the shift register 11. Every second data signal line of each group (for example, S2, S6, . . . ) are connected to the shift register 12. Every third data signal line of each group (for example, S3, S7, . . . ) are connected to the shift register 13. Every fourth data signal line of each group (for example, S4, S8, . . . ) are connected to the shift register 14.

The sampling analog switches 21 to 2*n* are provided for sampling a video signal Video sent to the video signal line 30. The sampling capacitors 41 to 4*n* are provided for retaining the video signal Video sampled by the sampling analog switches 21 to 2*n*, respectively.

The operation of the source driver having the above-mentioned structure will be described with reference to FIG. 13. The start of the four shift registers 11 to 14 is controlled by a shift start pulse SP which is common to the four shift registers 11 to 14. The shift registers 11 to 14 are controlled by a pair of shift clocks having opposite phases to each other and having an identical frequency with each other. Practically, the shift register 11 is controlled by a shift clock $\phi 1$ and an inversion signal thereof $\overline{\phi 1}$. The shift register 12 is controlled by a shift clock $\phi 2$ and an inversion signal thereof $\overline{\phi 2}$. The shift register 13 is controlled by a shift clock $\phi 3$ and an inversion signal thereof $\overline{\phi 3}$. The shift register 14 is controlled by a shift clock $\phi 4$ and an inversion signal thereof $\overline{\phi 4}$. There is a delay between the phases of the shift clocks corresponding to two adjacent sampling analog switches (for example, the shift clocks $\phi 1$ and $\phi 2$ corresponding to the sampling analog switches 21 and 22), the delay being $\frac{1}{4}$ of the period $\tau 0$ of the shift clock. In other words, the phase of the shift clock $\phi 2$ is delayed from the shift clock $\phi 1$ by $\frac{1}{4}$ of the period $\tau 0$ of the shift clock. In this way, the phases of pairs of the shift clocks and the inversion signals $\phi 1$, $\overline{\phi 1}$ to $\phi 4$, $\overline{\phi 4}$ are sequentially delayed by $\frac{1}{4}$ of the period $\tau 0$ of the shift clock. Accordingly, sampling analog switch control signals SR1 to SRn, which are outputs of the shift registers 11 to 14, have waveforms which are also sequentially delayed by $\frac{1}{4}$ of the period $\tau 0$ of the shift clock. The sampling analog switches 21 to 2*n* are conductive while the sampling analog switch control signals SR1 to SRn are at the active or "ON" level, respectively. During the period $\tau 0$ when the sampling analog switches 21 to 2*n* are conductive, a video signal Video is sampled by the sampling analog switches 21 to 2*n* and retained in the sampling capacitors 41 to 4*n*. More particularly, the sampling capacitors 41 to 4*n* retain the voltage of the video signal Video which is held when the sampling analog switches 21 to 2*n* are switched OFF.

Due to the above-mentioned operation, although the sampling analog switch control signals SR1 to SRn are sequentially delayed in the same manner as in a source driver having only one shift register, the period $\tau 0$ of the shift clock can be four times larger than the shift pulse width in the source driver having only one shift register. Thus, the shift registers 11 to 14 can be operated at a low speed.

The above-mentioned source driver, however, has the following problem. The periods in which the sampling analog switch control signals SR1 to SRn are at the ON level are delayed by $\frac{1}{4}$ of the period $\tau 0$ of the shift clock. That is, the periods are partially overlapped with each other. Accordingly, eight such signals, for example, SR1 to SR8 are simultaneously at the ON level. Thus, eight sampling analog switches 21 to 28 are simultaneously conductive, causing the video signal Video to be simultaneously supplied to the eight sampling capacitors 41 to 48 through the eight sampling analog switches 21 to 28. The source driver functions in the same manner concerning eight sampling analog switch control signals SR2 to SR9. As a result, the video signal line 30 or a circuit section for outputting a video signal Video is constantly loaded with the capacitance of the eight sampling capacitors 41 to 48. The capacitance and the wiring resistance of the video signal line 30 form an RC integrating circuit. The RC integrating circuit deteriorates the response of the sampling capacitors 41 to 4$n$ to the video signal Video, and thus the waveforms of the video signal Video are distorted in the sampling capacitors 41 to 4$n$. The video signal Video having such distorted waveforms does not retain band data which was inputted thereto in, for example, a liquid crystal display apparatus. An image which is formed based on such a video signal Video has a low horizontal resolution.

SUMMARY OF THE INVENTION

A driving circuit for use in a display apparatus for transmitting a video signal to data lines accordingly to the present invention includes a plurality of shift registers for sequentially outputting signals so that high periods thereof in which the signals are high are partially overlapped sequentially; a control signal generating circuit for outputting a control signal which is at the ON level during a period shorter than a pulse width of the signals outputted by the shift registers; a switching circuit controlled to be in ON or OFF based on the control signal; and a sampling capacitor for receiving the video signal through the switching circuit and for holding the video signal by the control of the switching circuit to be ON or OFF. The video signal held by the sampling capacitor is transmitted to the data lines.

In one embodiment of the invention, the control signal is at the ON level during a period in which a pair of the signals outputted by the shift registers having the high periods partially overlapped with each other are both high.

In another embodiment of the invention, the control signal generating circuit includes a NAND gate for obtaining a NAND signal of the pair of the signals and for outputting the NAND signal as an output; and an inverter for inverting the output from the NAND gate.

In still another embodiment of the invention, the switching circuit includes a CMOS device which has an NMOS device having a gate receiving an output from the inverter and a PMOS device having a gate receiving an output from the NAND gate.

In still another embodiment of the invention, the control signal is at the ON level during a period in which an inversion signal obtained by inverting either one of a pair of the signals outputted by the shift registers having the high periods partially overlapped with each other and the other signal of the pair of the signals are both high.

In still another embodiment of the invention, the control signal generating circuit includes an inverter for inverting either one of the pair of the signals and outputting the inversion signal; and an AND gate for obtaining an AND signal of the inversion signal and the other signal and outputting the AND signal.

In still another embodiment of the invention, the shift registers are bidirectionally shifting.

In still another embodiment of the invention, the shift registers are provided in one or more groups of four.

In a driving circuit for use in a display apparatus according to the present invention, a plurality of shift registers sequentially output signals, and high periods thereof in which the signals are high are partially overlapped sequentially. Accordingly, the shift registers can be operated in a low speed as in a conventional circuit.

A control signal generating circuit outputs a control signal which is at the ON level during a period in which a pair of the signals from the shift registers having the high periods partially overlapped with each other are both high. Since a switching circuits is controlled to be ON or OFF based on the control signal, the period in which the switching circuit is conductive is shorter than in the conventional circuit. Accordingly, the number of such switching circuits which are simultaneously conductive is smaller than in the conventional circuit. As a result, the capacitance of sampling capacitors applied on a video signal line is alleviated.

Alternatively, the control signal generating circuit generates a control signal which is at the ON level during a period in which an inversion signal obtained by inverting either one of a pair of the signals from the shift registers having the high periods partially overlapped with each other and the other signal of the pair of the signals are both high. In this case also, since the switching circuit is controlled to be ON or OFF, the period in which the switching circuit is conductive is shorter than in the conventional circuit. Accordingly, the number of such switching circuits which are simultaneously conductive is smaller than in the conventional circuit. As a result, the capacitance of the sampling capacitors applied on the video signal line is alleviated.

Thus, the invention described herein makes possible the advantages of providing a driving circuit for use in a display apparatus for lowering the operating speed of a shift register while maintaining the waveform of a video signal which is necessary to form an image having a high horizontal resolution.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

EXAMPLE 1

Figure 1A:
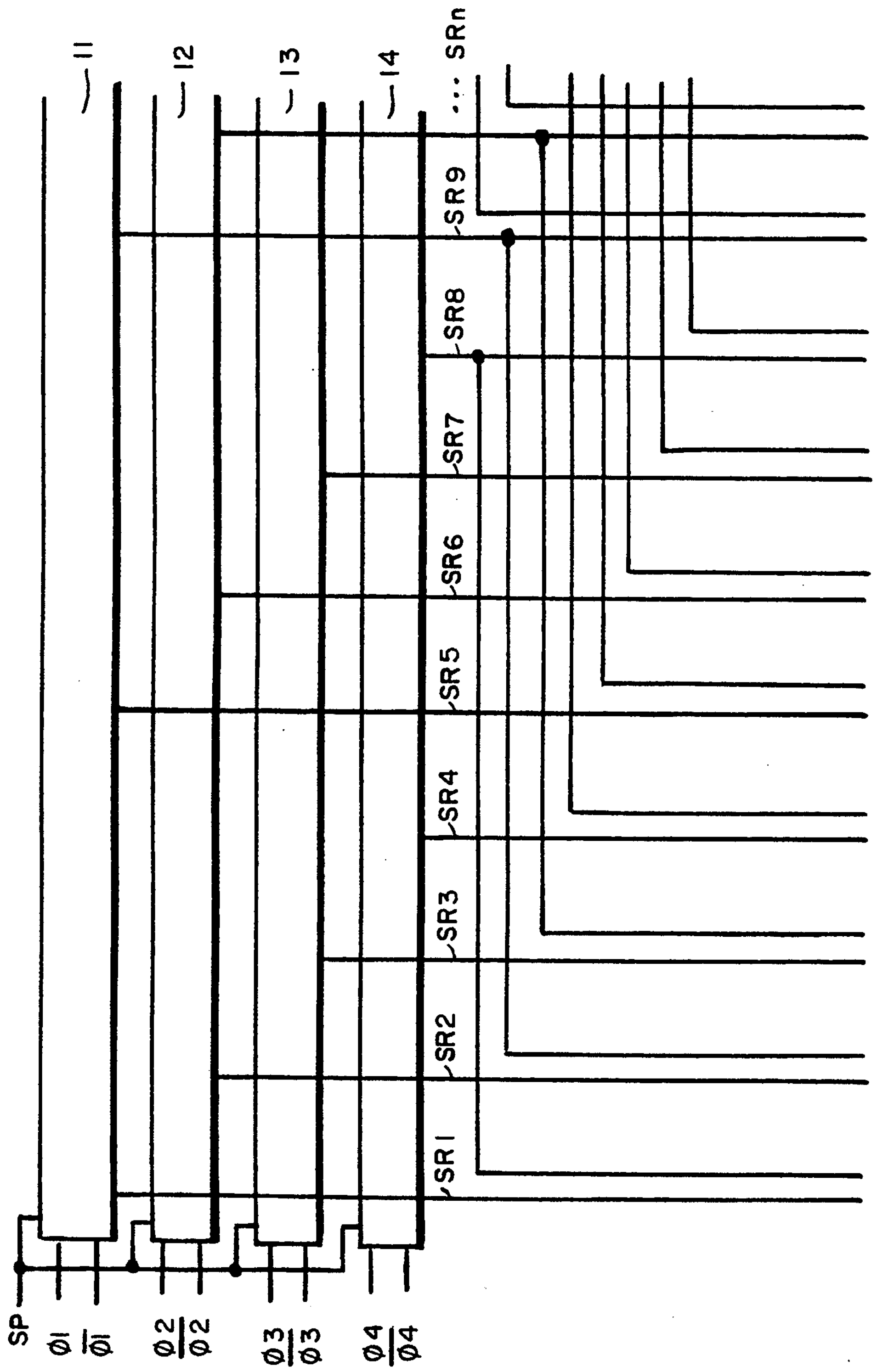
FIG. 1 is a structural configuration of a source driver including a driving circuit for use in a display apparatus in a first example according to the present invention.
Figure 1B:
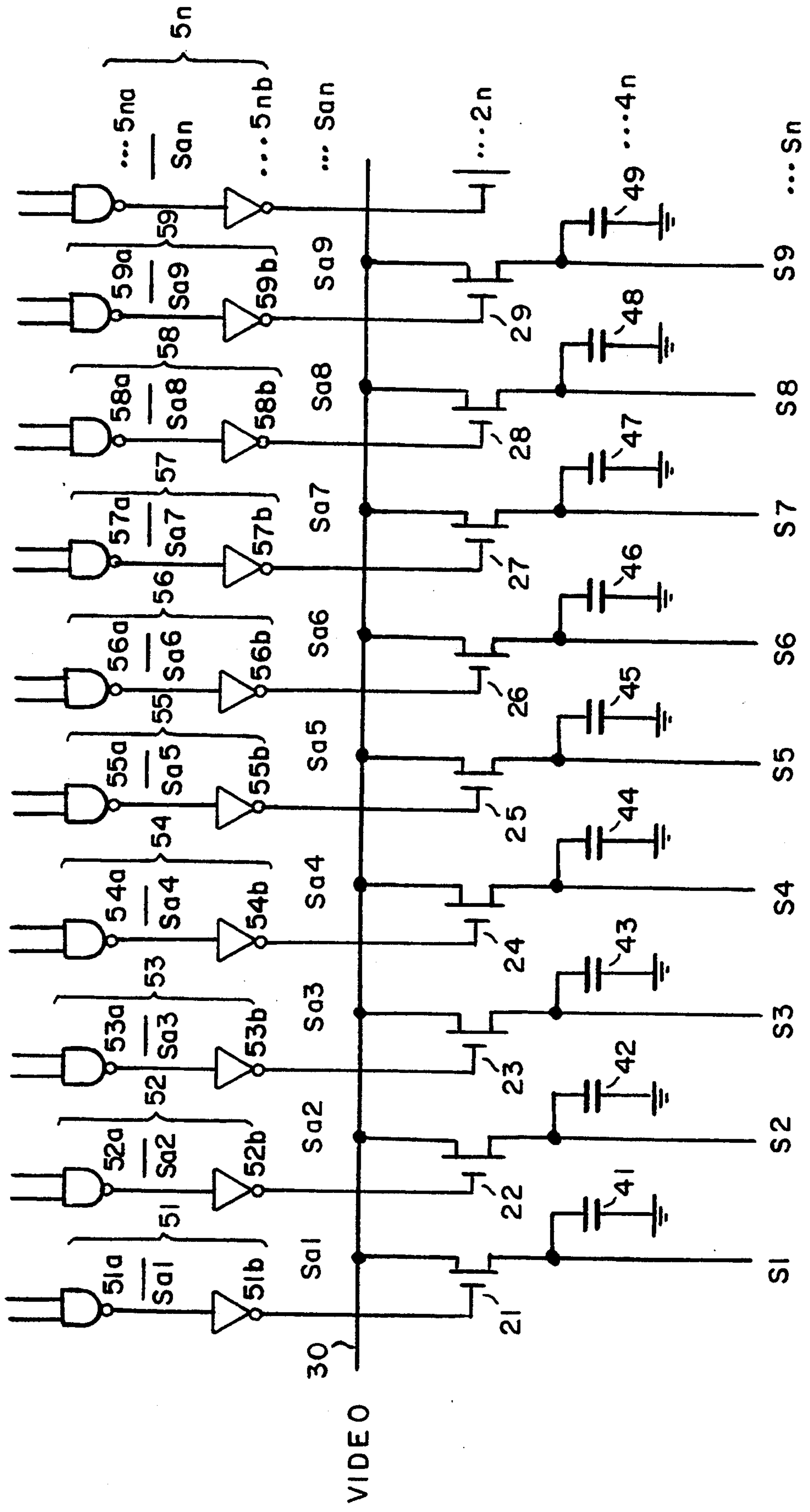
Figure 12:
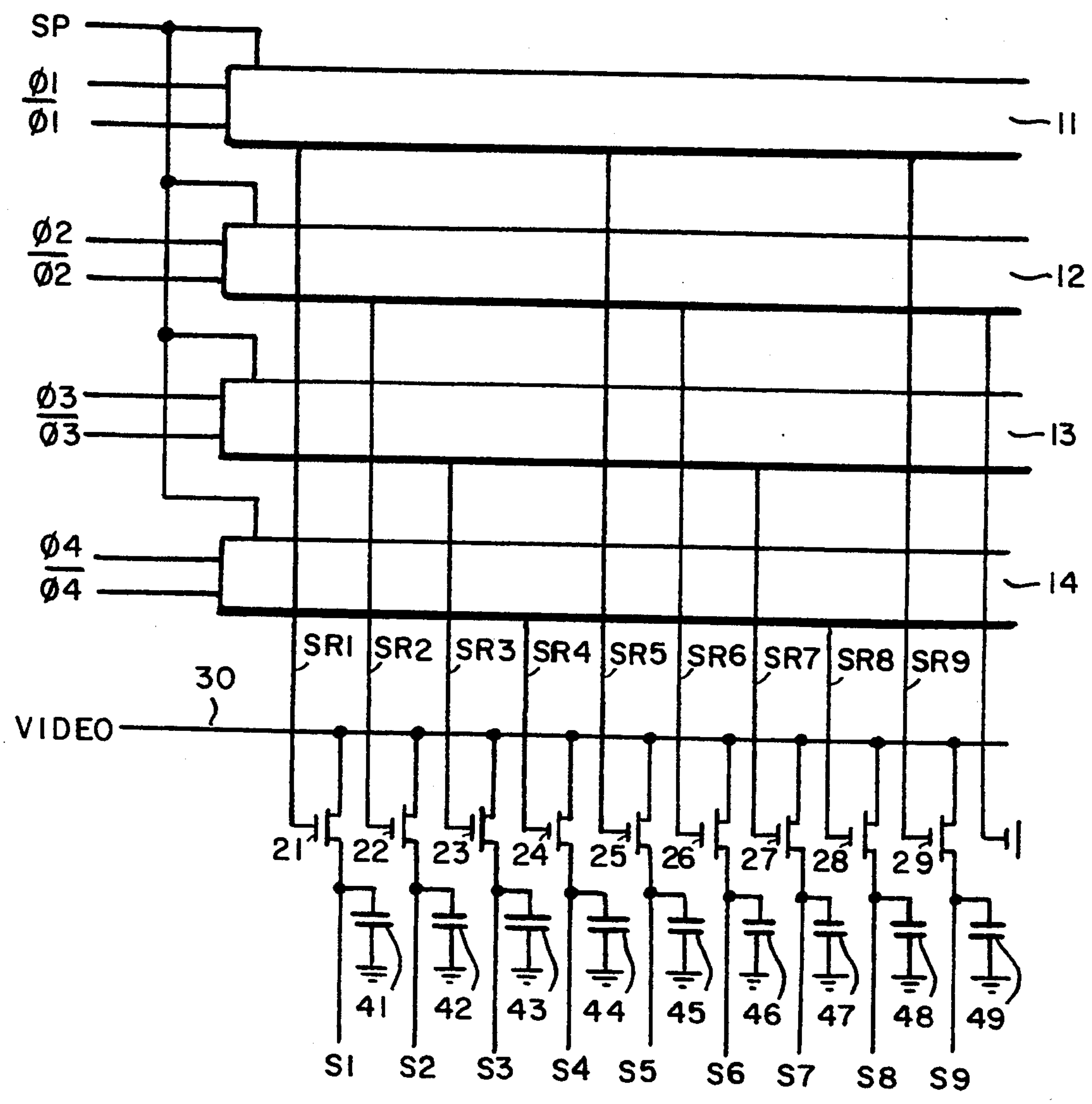
FIG. 12 is a structural configuration of a conventional source driver.
Figure 13:
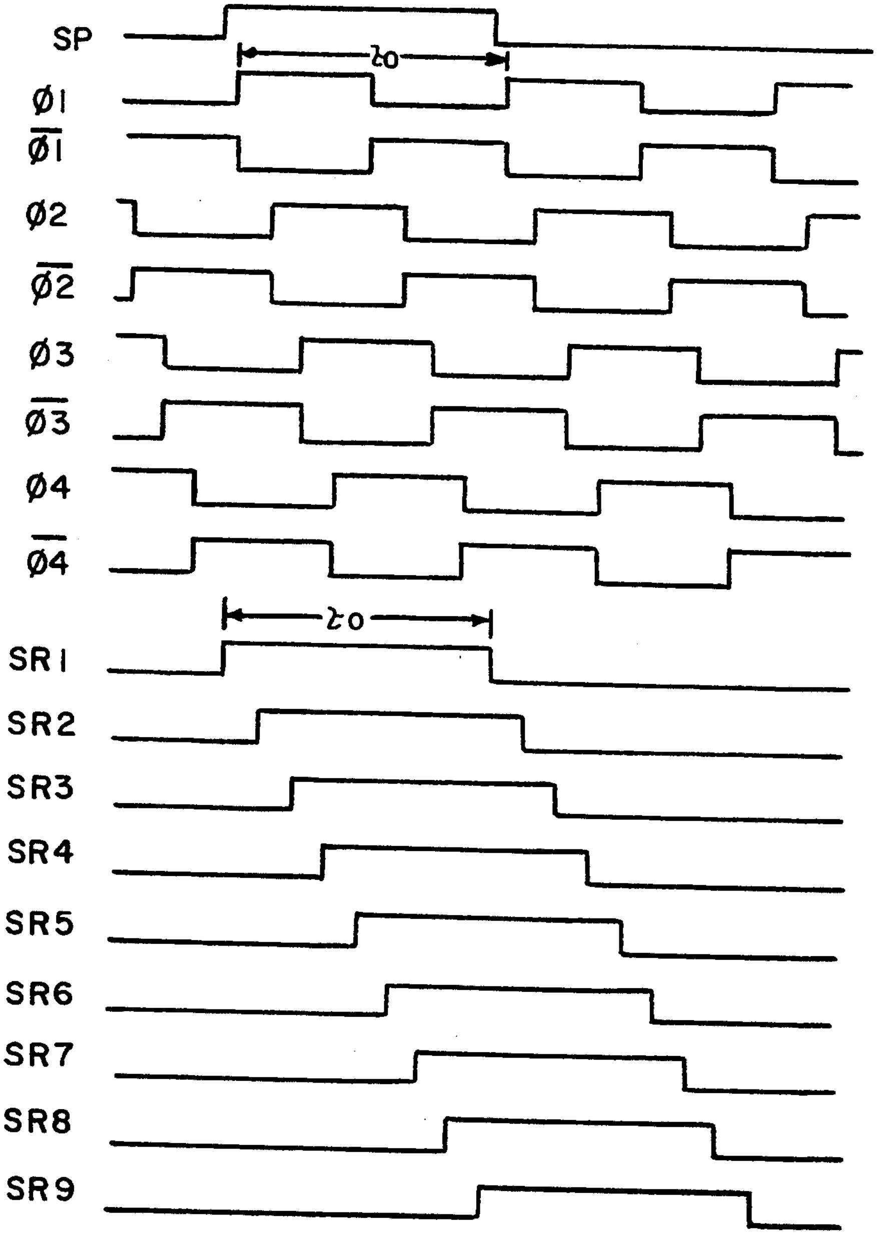
FIG. 13 is a time chart illustrating the operation of the conventional source driver shown in FIG. 12.

FIG. 1 illustrates a structure of a source driver including a driving circuit for use in a display apparatus in a first example according to the present invention. Identical elements with those in FIG. 12 bear identical reference numerals therewith.

As is shown in FIG. 1, the source driver includes four shift registers 11 to 14, sampling analog switches 21 to **2*n* controllably opened and closed by the shift registers 11 to 14, control signal generating circuits 51 to 5*n* provided between the shift registers 11 to 14 and the sampling analog switches 21 to 2*n*, a video signal line 30 to which a video signal Video is sent, and sampling capacitors 41 to 4*n* connected both to the video signal line 30 through the sampling analog switches 21 to 2*n*. Data signal lines S1** to S*n* connected to pixels (not shown) are branched to be connected to the sampling analog switches 21 to 2n and to the sampling capacitors 41 to **4*n*. The data signal lines S1** to S*n* are divided into groups each including four adjacent data signal lines (for example, S1, S2, S3 and S4). The four data signal lines of each group are respectively connected to the sampling analog switches. The sampling analog switches are connected to the shift registers 11 to 14 in the following manner. For example, the sampling analog switches (for example, 21, 25 and 29) corresponding to every first data signal line of each group (for example, S1, S5 and S9) are connected to the shift registers 11 and 14. The sampling analog switches (for example, 22 and 26) corresponding to every second data signal line of each group (for example, S2 and S6) are connected to the shift registers 12 and 11.

The sampling analog switches 21 to **2*n* are each formed of an NMOS (n-channel metal-oxide-semiconductor) device, and are provided for sampling a video signal Video sent to the video signal line 30. The sampling capacitors 41 to 4*n* are provided for retaining the video signals Video sampled by the sampling analog switches 21 to 2*n*. The control signal generating circuits 51 to 5*n* are respectively formed of NAND gates 51*a* to 5*na* and inverters 51*b* to 5*nb* connected to the outputs of the NAND gates 51*a* to 5*na*. The NAND gates 51*a* to 5*na* each receive the outputs from two of the four shift registers 11 to 14. The outputs from the inverters 51*b* to 5*nb* control the sampling analog switches 21 to 2*n***, respectively.

Figure 2:
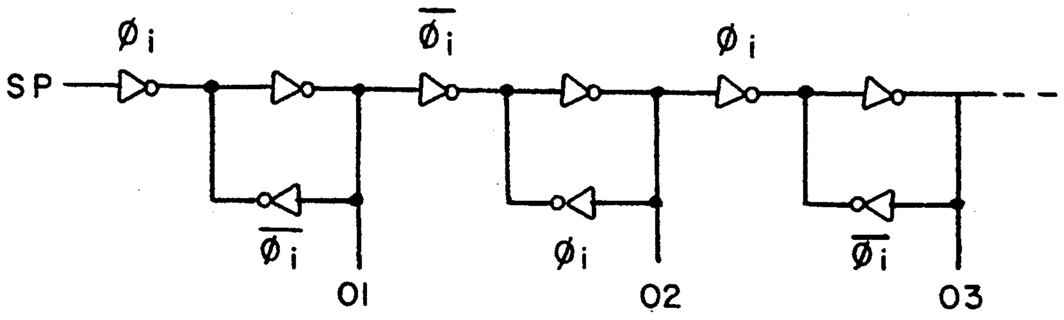
FIG. 2 is a circuit diagram illustrating an internal structure of a shift register for use in the source driver shown in FIG. 1.
Figure 3:
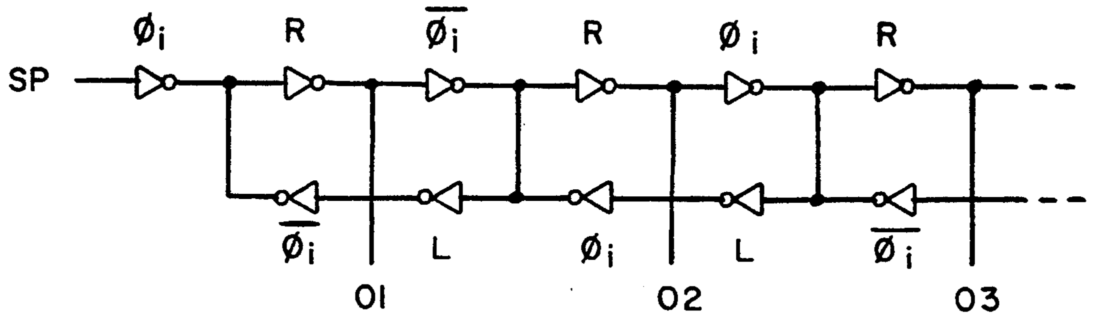
FIG. 3 is a circuit diagram illustrating an internal structure of another shift register for bidirectional shifting for use in the source driver shown in FIG. 1.

FIGS. 2 and 3 illustrate circuits of shift registers 11 to 14 for use in the source driver having the above-mentioned structure. The clocked inverters are each shown with the signal for controlling the corresponding clocked inverter. The four shift registers 11 to 14 have identical circuit structure with one another. The shift registers 11 to 14 may be a combination of inverters and clocked inverters as shown in FIG. 2, or may be of a bidirectional shifting type as shown in FIG. 3.

Figure 4:
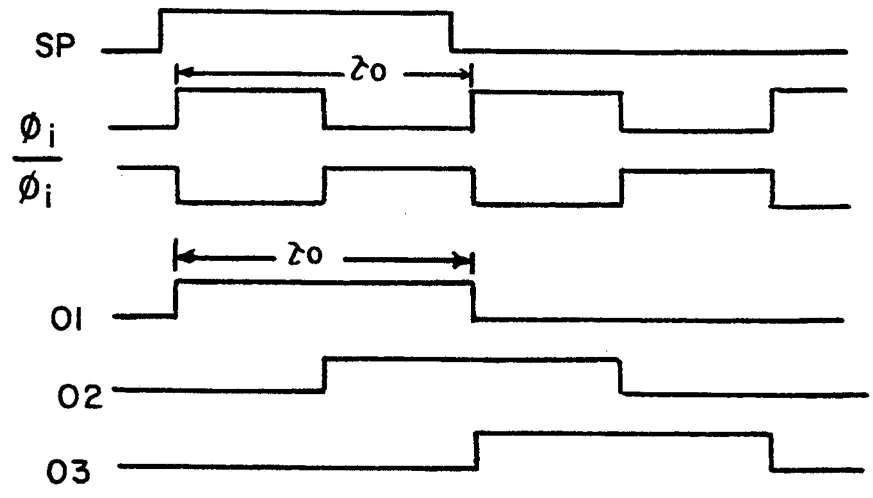
FIG. 4 is a time chart illustrating the operation of the shift register shown in FIG. 2.

FIG. 4 shows a time chart illustrating the operation of the shift registers 11 to 14. The shift registers 11 to 14 are controlled by a shift start pulse SP, a shift clock $\phi i$ and an inversion signal thereof $\overline{\phi i}$. Thus, the shift registers 11 to 14 serially output shift pulses as signals 01 to On each having a pulse width $\tau 0$ which is equal to the period of the shift clock.

In the shift registers 11 to 14 for bidirectional shifting shown in FIG. 3, the shifting direction is controlled by signals R and L. When the signal R is high and the signal L is low, the clocked inverters which are controlled by the signal R constantly output an inversion signal, and the clocked inverters which are controlled by the signal L constantly have a high impedance. As a result, the shift register shifts from left to right in FIG. 3. By contrast, when the signal R is low and the signal L is high, the clocked inverters function in the opposite way. As a result, the shift register shifts from right to left in FIG. 3. The shift registers 11 to 14 having the structure shown in FIG. 3 are controlled by a shift clock $\phi i$ and an inversion signal thereof $\overline{\phi i}$ in the same manner as the shift registers 11 to 14 having the structure shown in FIG. 2. The time chart in FIG. 4 illustrates the operation performed when the signal R is high and signal L is low.

Figure 5:
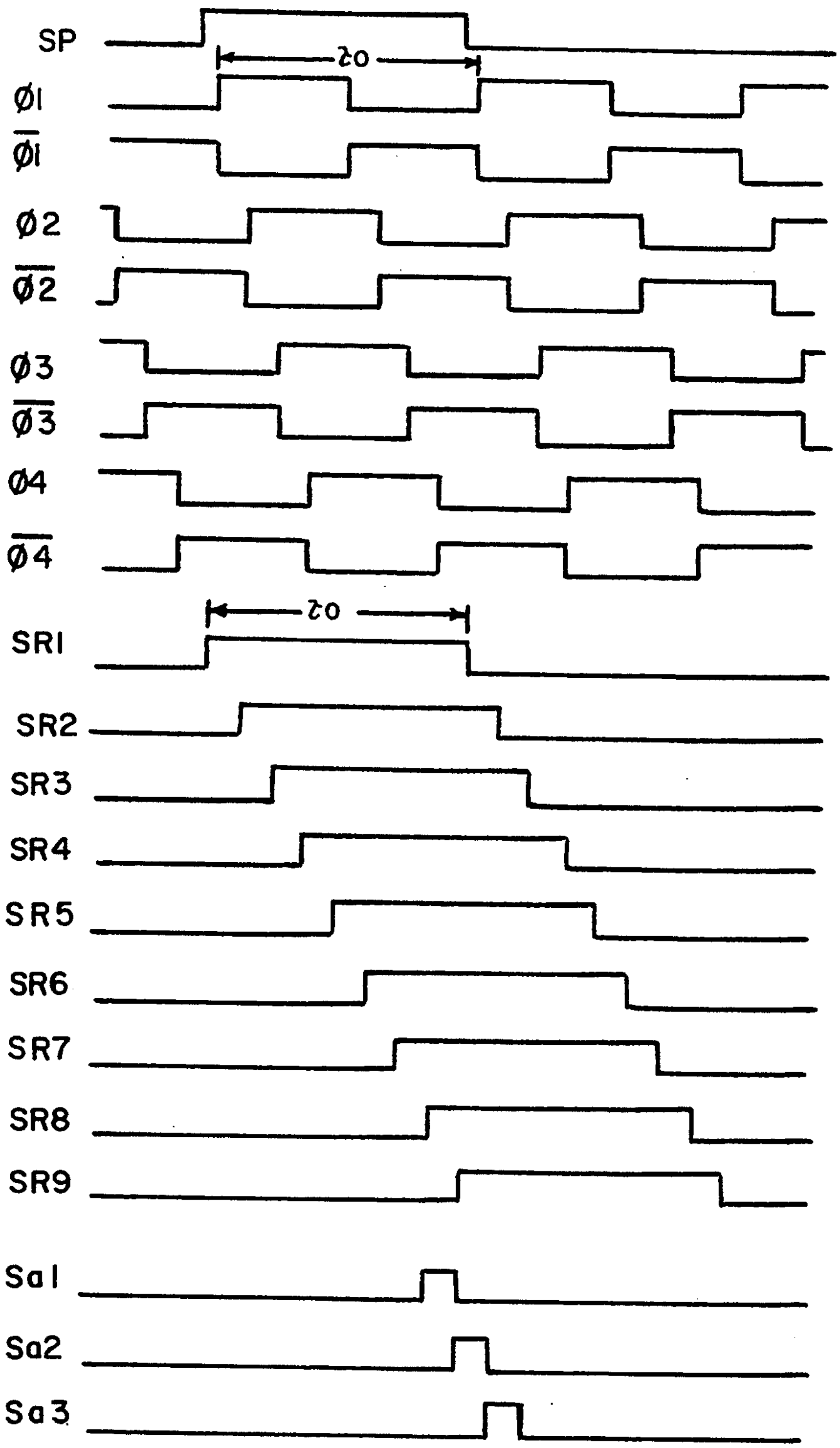
FIG. 5 is a time chart illustrating the operation of the source driver shown in FIG. 1.

FIG. 5 is a time chart of an operation of the source driver.

The start of the four shift registers 11 to 14 is controlled by a shift start pulse SP. One shift start pulse SP may be commonly provided to the four shift registers 11 to 14. The shift registers 11 to 14 are controlled by a pair of shift clocks having opposite phases to each other and having an identical frequency with each other. Practically, the shift register 11 is controlled by a shift clock $\phi 1$ and an inversion signal thereof $\overline{\phi 1}$. The shift register 12 is controlled by a shift clock $\phi 2$ and an inversion signal thereof $\overline{\phi 2}$. The shift register 13 is controlled by a shift clock $\phi 3$ and an inversion signal thereof $\overline{\phi 3}$. The shift register 14 is controlled by a shift clock $\phi 4$ and an inversion signal thereof $\overline{\phi 4}$. There is a delay between the phases of the shift clocks corresponding to two adjacent sampling analog switches (for example, shift clocks $\phi 1$ and $\phi 2$ corresponding to the sampling analog switches 21 and 22), the delay being $\frac{1}{8}$ of the period $\tau 0$ of the shift clock. In other words, the phase of the shift clock $\phi 2$ is delayed from the phase of the shift clock $\phi 1$ by $\frac{1}{8}$of the period $\tau 0$ of the shift clock. In this way, the phases of pairs of the shift clocks and the inversion signals $\phi 1$, $\overline{\phi 1}$, to $\phi 4$, $\overline{\phi 4}$, are sequentially delayed by $\frac{1}{8}$ of the period $\tau 0$ of the shift clock. Accordingly, sampling analog switch control signals SR1 to SRn, which are outputs of the shift registers 11 to 14, have waveforms which are also sequentially delayed by $\frac{1}{8}$ of the period $\tau 0$ of the shift clock. The output signals O1 to On in FIG. 4 correspond to every fourth output signal in FIG. 5 (for example, SR1, SR5 and SR9).

One output signal SRj (j is an integer of 1 or more) of the output signals SR1 to SRn and another output signal SRj+7 are inputted to the corresponding NAND gate **5*j*, and thus an inversion signal $\overline{Saj}$ of a logical product of the two signals is obtained. The output signal $\overline{Saj}$ obtained in this manner is inputted to the corresponding inverter 5*jb*. The inverter 5*jb* inverts the signal to Saj. The signal Saj is inputted to the corresponding sampling analog switch 2*j* formed of an NMOS device. Then, the sampling analog switch 2*j* is controlled to be ON or OFF. When being on, the sampling analog switch 2*j* is turned conductive, thereby charging the sampling capacitor 4*j* connected thereto until the sampling capacitor 4*j*** obtains a voltage of the video signal Video.

Thereafter, the sampling capacitor **4*j* stores the level of the voltage of the video signal Video obtained when the corresponding sampling analog switch 2*j*** is switched OFF. The voltage held in this manner is used as an input signal to the data signal line Sj of, for example, a liquid crystal display apparatus.

In the source driver operated in the abovementioned manner, the signals Sa1 to San for controlling the sampling analog switches 21 to **2*n* each have a pulse width of $\frac{1}{8}\tau O$ due to the control signal generating circuits 51 to 5*n* as is shown in FIG. 5. Accordingly, two or more sampling analog switches are never conductive simultaneously, and thus the video signal line 30** is always loaded with a capacitance of only one sampling capacitor. For this reason, the RC time constant is $\frac{1}{8}$ of that in the conventional source driver, thereby remarkably reducing the distortion of the waveform of the video signal Video caused by the RC integrating circuit. As a result, an image having a high horizontal resolution can be obtained.

In the above example, the control signal generating circuits 51 to **5*n* include the NAND gates 51*a* to 5*na* instead of AND gates. This is because NAND gates are easily formed of a CMOS device. The control signal generating circuits 51 to 5*n*** may have any other structure as long as a logical product can be obtained. For example, a structure for obtaining a NOR of the inversion signals may be used.

Figure 6:
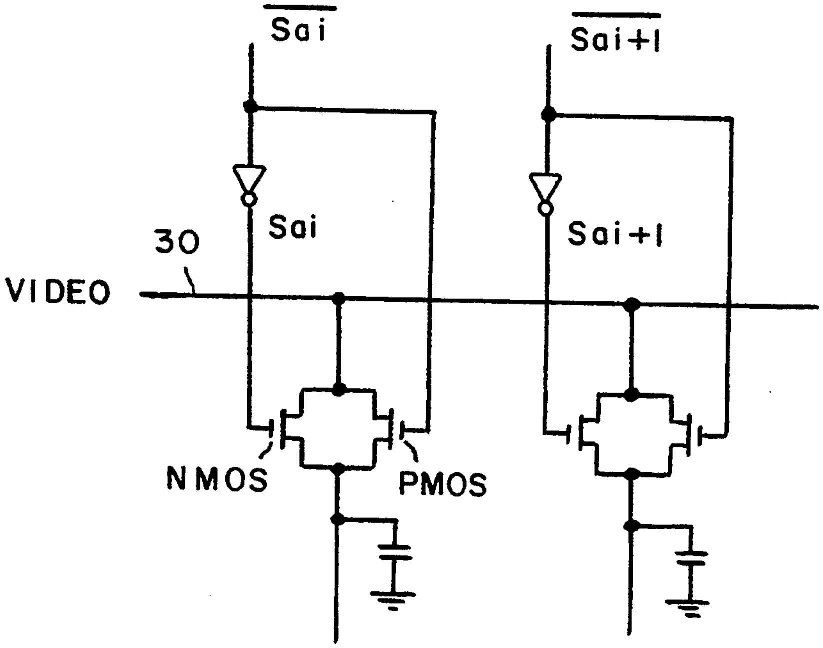
FIG. 6 is a circuit diagram of sampling analog switches for use in the source driver shown in FIG. 1. in the case where the sampling analog switches are each formed of a CMOS (complementary metal-oxide-semiconductor) device.

The sampling analog switches 21 to **2*n* may have a structure shown in FIG. 6. The sampling analog switches shown in FIG. 6 are each formed of a CMOS device, in which output signals Sa1 to San from the inverters 51*b* to 5*nb* and output signals $\overline{Sa1}$ to San from the NAND gates 51*a* to 5*na* are both used. Needless to say, the switches 21 to 2*n*** may be formed of a PMOS (p-channel metal-oxide-semiconductor) device.

In this example, four shift registers 11 to 14 are provided. The present invention is applicable to a source driver having shift registers in any number of two or more.

In the control signal generating circuits 51 to **5*n*, one output signal SRj among the output signals SR1 to SRn from the shift registers 11 to 14 is combined with another such output signal SRj+7 to produce a logical product. The output signal to be combined with SRj may be any signal which is at the ON level simultaneously with output signal SRj. For example, the output signals SRj and SRj+6 may be combined. In this case, two of the sampling analog switches 21 to 2*n*** are constantly conductive simultaneously. However, the number of the sampling analog switches which are simultaneously conductive is much smaller than that in the conventional source driver. Accordingly, an image having a high horizontal resolution can be obtained.

EXAMPLE 2

Figure 7A:
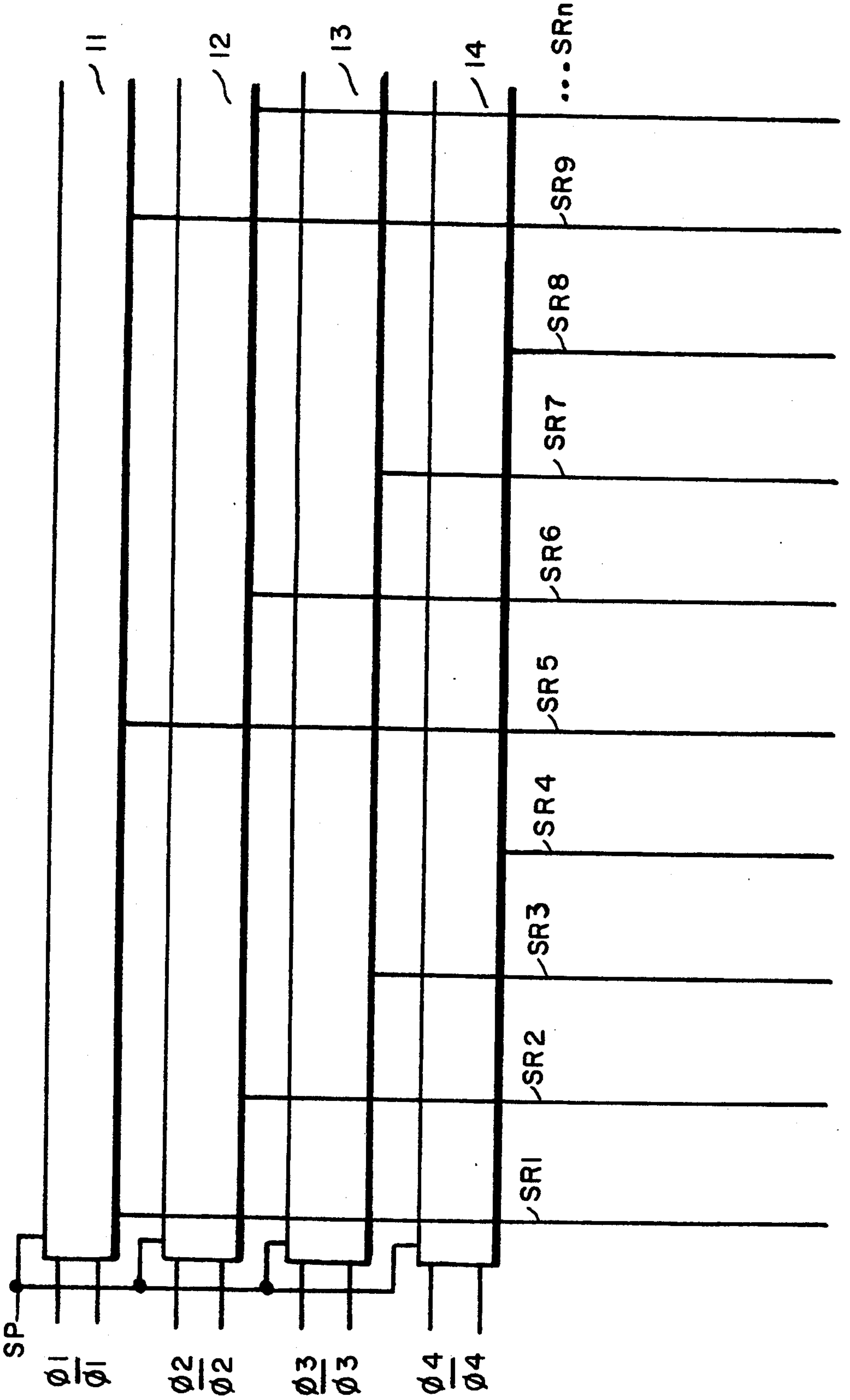
FIG. 7 is a structural configuration of a source driver including a driving circuit for use in a display apparatus in a second example according to the present invention.
Figure 7B:
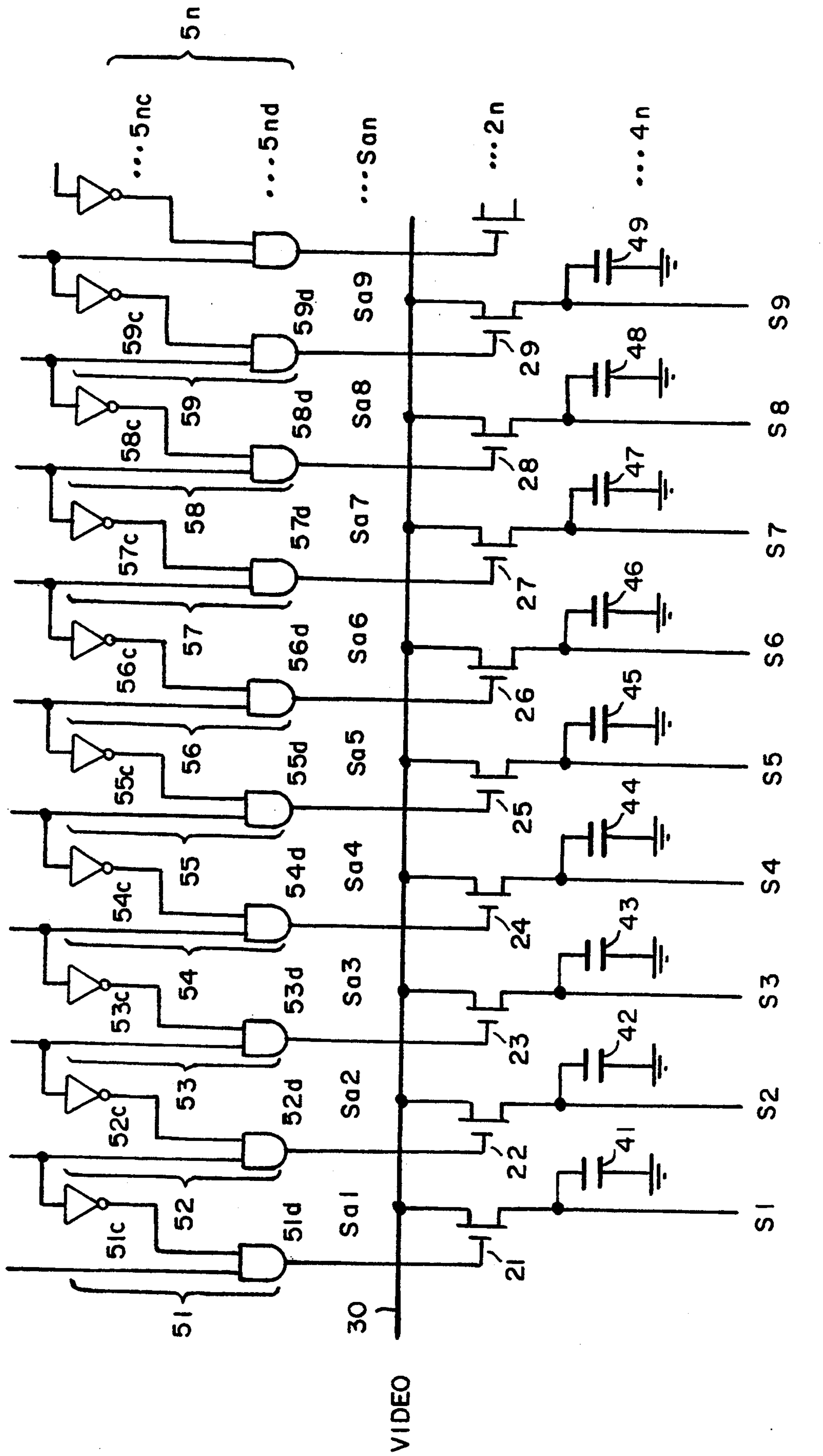
Figure 8:
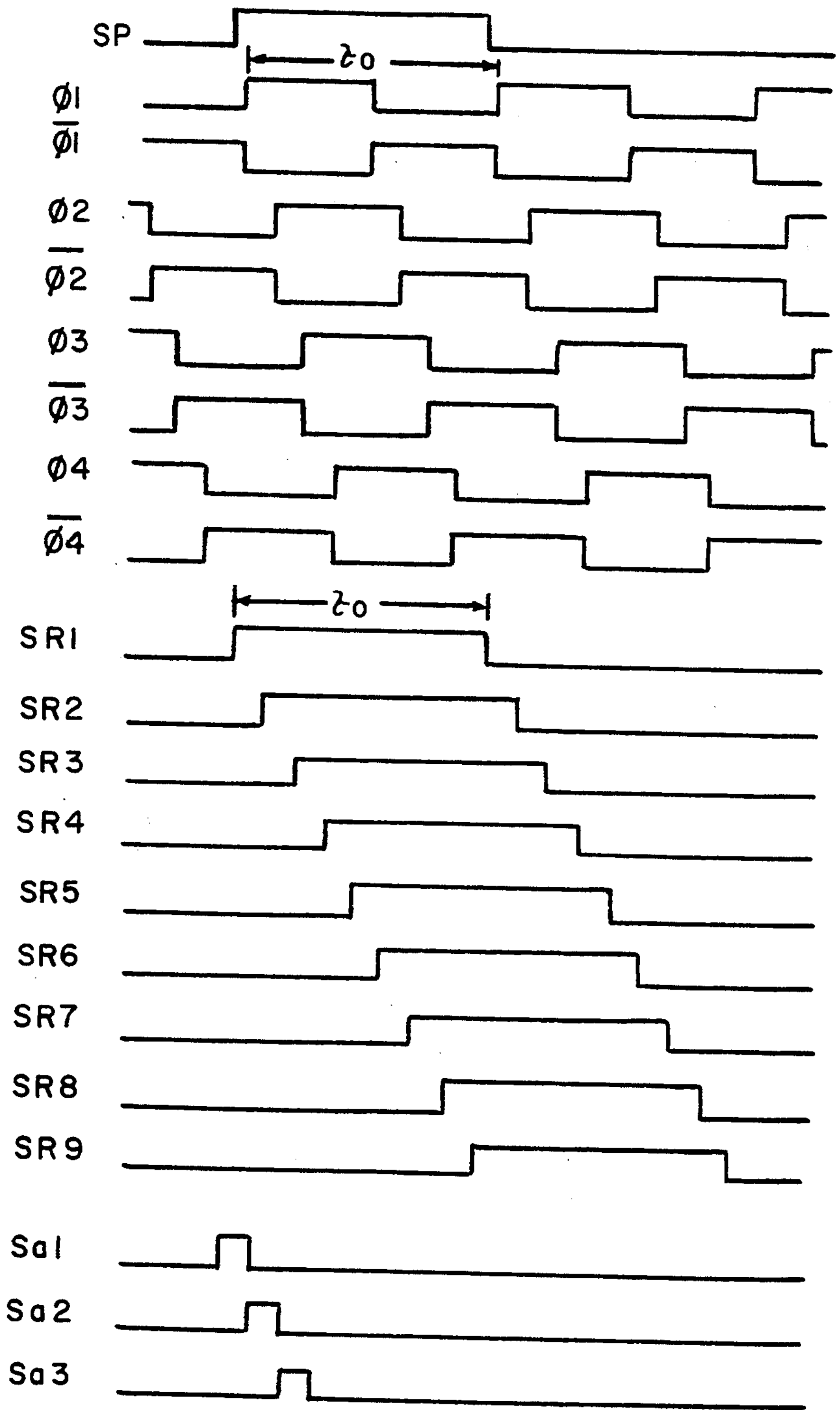
FIG. 8 is a time chart illustrating the operation of the source driver shown in FIG. 7.

FIG. 7 illustrates a structure of a source driver including a driving circuit for use in a display apparatus in a second example according to the present invention. FIG. 8 is a time chart of an operation of the source driver shown in FIG. 7. Identical elements with those in the first example bear identical reference numerals therewith.

One output signal SRj (j is an integer of 1 or more) of the output signals SR1 to SRn and another signal $\overline{SRj+1}$ obtained by inverting the signal SRj+1 by the corresponding inverter **5*jc* are inputted to corresponding AND gate 5*jd*, and thus a signal Saj is obtained as a logical product of the two signals SRj and $\overline{SRj+1}$. The output signal Saj obtained in this manner is inputted to the corresponding sampling analog switch 2*j* formed of an NMOS device. Then, the sampling analog switch 2*j* is controlled to be ON or OFF. When being on, the sampling analog switch 2*j* is conductive, thereby charging the sampling capacitor 4*j* connected thereto until the sampling capacitor 4*j* obtains a voltage of the video signal Video. Thereafter, the sampling capacitor 4*j* stores the level of the voltage of the video signal Video obtained when the corresponding sampling analog switch 2*j*** is switched OFF. The voltage held in this manner is used as an input signal to the data signal line Sj of, for example, of a liquid crystal display apparatus.

In the source driver operated in the abovementioned manner, the signals Sa1 to San for controlling the sampling analog switches 21 to **2*n* each have a pulse width of $\frac{1}{8}\tau 0$ due to the control signal generating circuits 51 to 5*n* as is shown in FIG. 8. Accordingly, two or more sampling analog switches are never conductive simultaneously, and thus the video signal line 30** is always loaded with a capacitance of only one sampling capacitor. For this reason, the RC time constant is $\frac{1}{8}$ of that in the conventional source driver, thereby remarkably reducing the distortion of the waveform of the video signal Video caused by the RC integrating circuit. As a result, an image having a high horizontal resolution can be obtained.

In the control signal generating circuits 51 to **5*n*, one output signal SRj among the output signals SR1 to SRn from the shift registers 11 to 14 is combined with another such output signal SRj+1 to produce a logical product. The output signal to be combined with SRj may be the inversion signal of any signal which is at the ON level simultaneously with output signal SRj. For example, the output signals SRj and $\overline{SRj+2}$ may be combined. In this case, two of the sampling analog switches 21 to 2*n*** are constantly conductive simultaneously. However, the number of the sampling analog switches which are simultaneously conductive is much smaller than that in the conventional source driver. Accordingly, an image having a high horizontal resolution can be obtained.

EXAMPLE 3

Figure 9A:
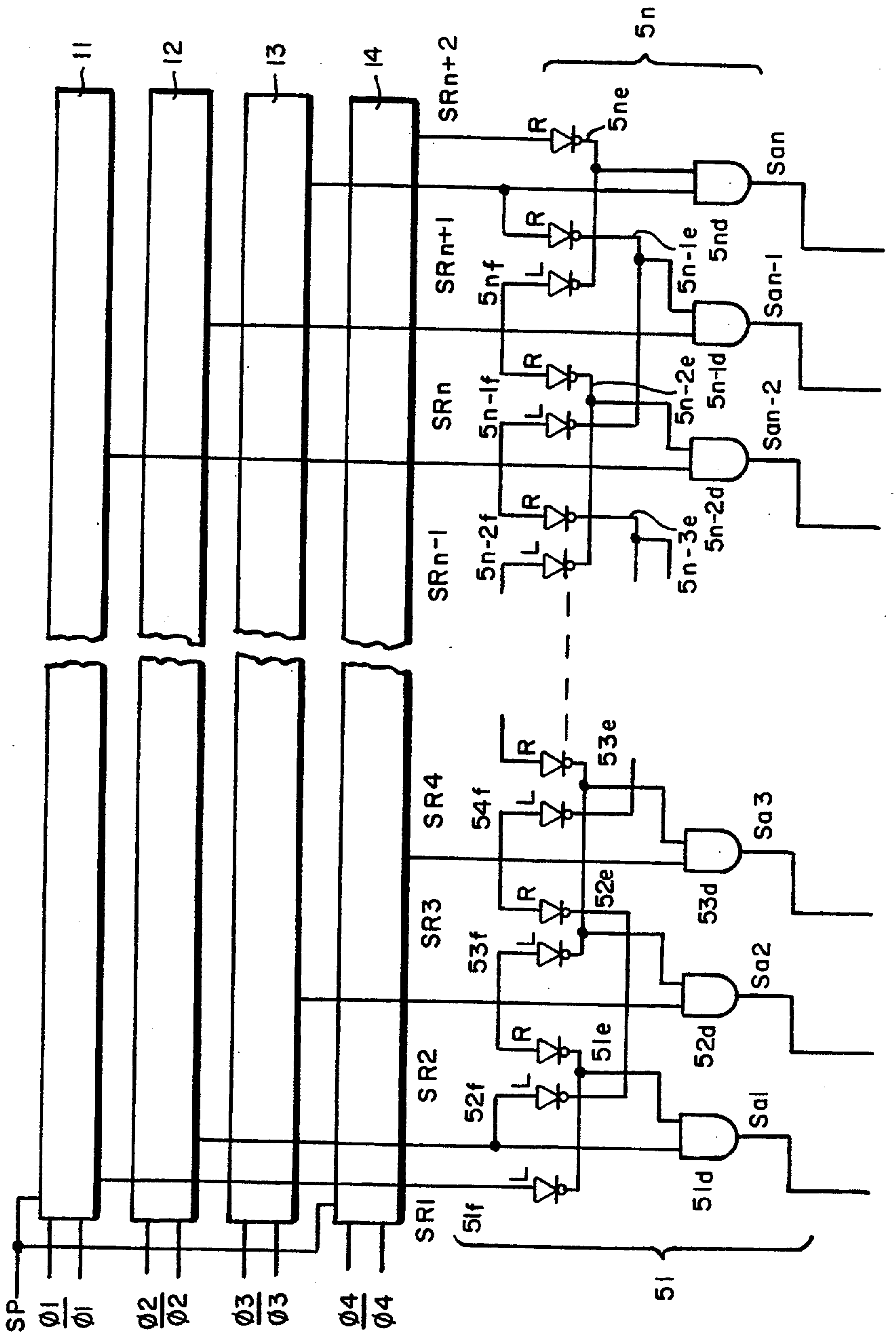
FIG. 9 is a structural configuration of a source driver including a driving circuit for use in a display apparatus in a third example according to the present invention.
Figure 9B:
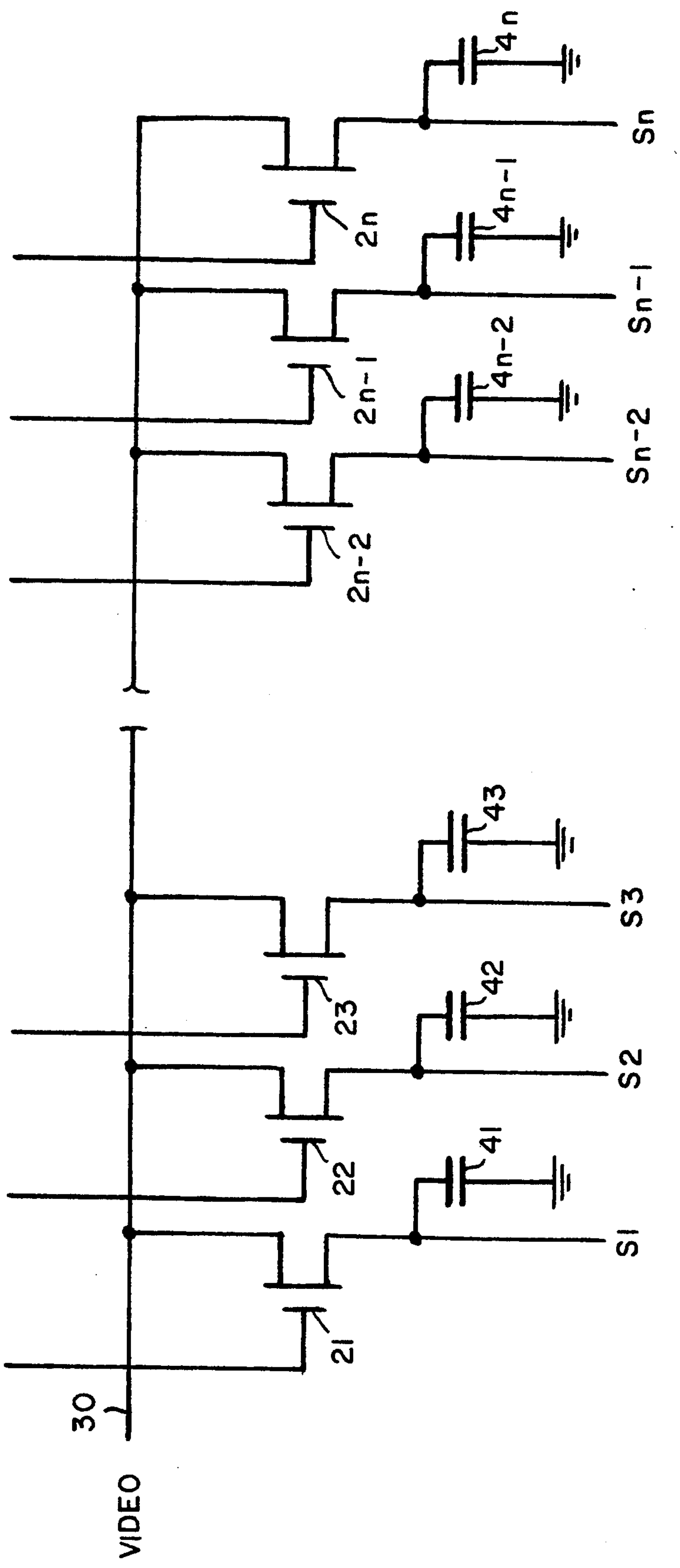

FIG. 9 illustrates a structure of a source driver including a driving circuit for use in a display apparatus in a third example according to the present invention. In this example, the shift registers 11 to 14 each has a structure shown in FIG. 3, so that the source driver can be bidirectionally shifted. Accordingly, the control generating circuits 51 to **5*n*** have a different structure from that in the second example, but the other elements are identical with those in the second example. The identical elements bear identical reference numerals therewith, and explanation thereof will be omitted.

The control signal generating circuits 51 to **5*n* respectively include clocked inverters 51*e* to 5*ne* for shifting from left to right, clocked inverters 51*f* to 5*nf* for shifting from right to left, and AND gates 51*d* to 5*nd* connected both to the clocked inverters 51*e* to 5*ne* and to the clocked inverters 51*f* to 5*nf*. The clocked inverters 51*e* to 5*ne* and the clocked inverters 51*f* to 5*nf* both receive output signals SR1 to SRn+2 from the shift registers 11 to 14. In detail, whereas the signals SR1 to SRn are inputted to the clocked inverters 51*f* to 5*nf*, the signals SR3 to SRn+2 are inputted to the clocked inverters 51*e* to 5*ne*. The AND gates 51*d* to 5*nd* receive signals between the signals SR1 to SRn and signals SR3 to SRn+2, namely, signals SR2 to SRn+1. Output signals Sa1 to San from the AND gates 51_d_ to 5_nd_ control the sampling analog switches 21 to 21**_n_.

Figure 10:
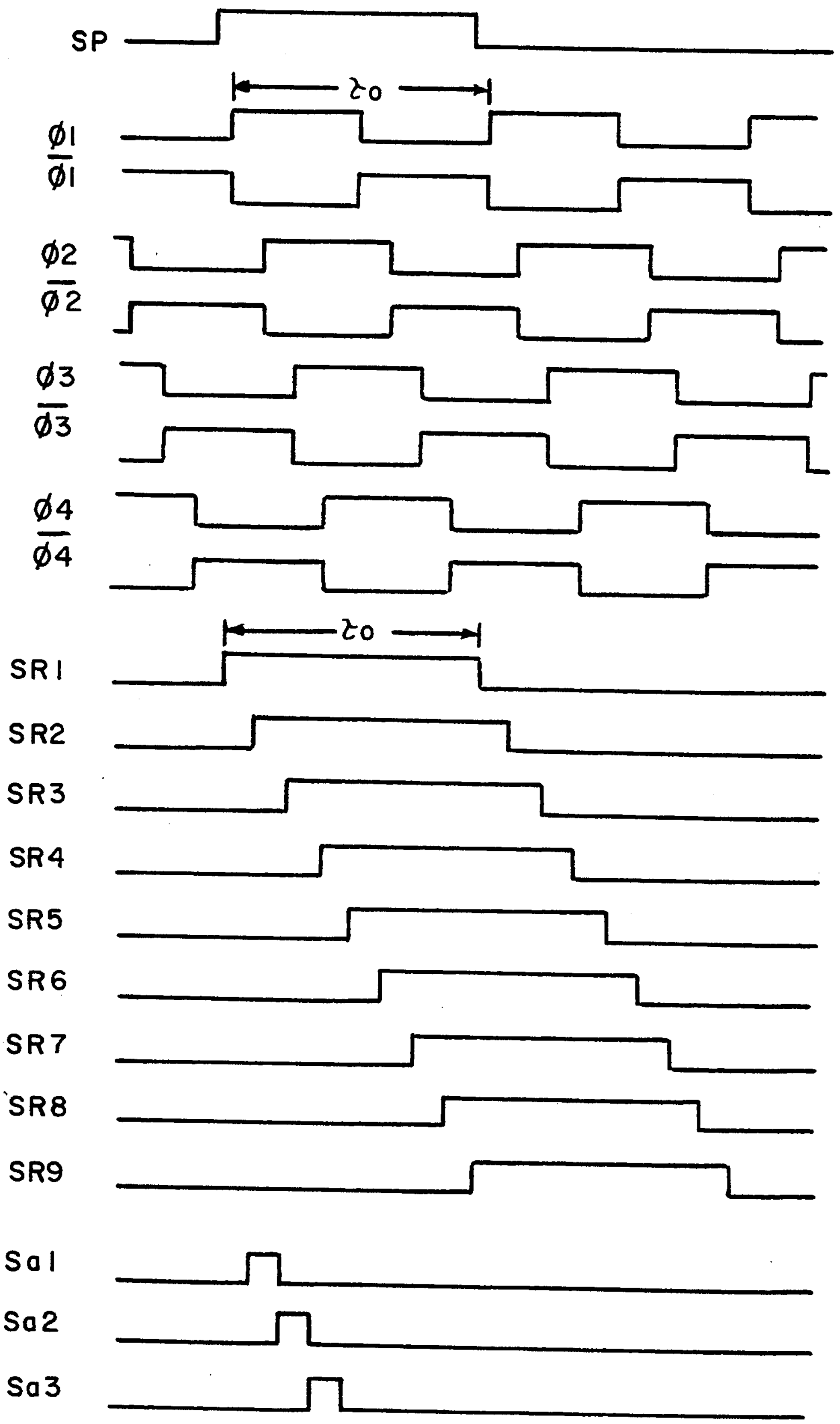
FIG. 10 is a time chart illustrating the operation of the source driver shown in FIG. 9.

The operation of the source driver in this example will be described with reference to FIGS. 10 and 11. In FIG. 10, the source driver is shifted to right, and in FIG. 11, the source driver is shifted to left.

In the control signal generating circuits 51 to 5_n_, the shifting direction is controlled by the signals R and L. When the signal R is high and the signal L is low, the clocked inverters 51_e_ to 5_ne_ controlled by the signal R constantly output inversion signals, and the clocked inverters 51_f_ to 5_nf_ controlled by the signal L constantly have a high impedance. As a result, the source driver is shifted from left to right as in the shift register shown in FIG. 2 shifting in one direction. By contrast, when the signal R is low and the signal L is high, the source driver is shifted from right to left in FIG. 9.

The operation of the source driver will be described based on one output signal SRj+1(j is an integer of 1 or more) of the output signals SR1 to SRn as an example.

In order to shift the source driver from left to right, the clocked inverter 5_je_ outputs an inversion signal $\overline{SRj+2}$ of the signal SRj+2 to the AND gate 5_jd_. As a result, the AND gate 5_jd_ receives the signals SRj+1 and $\overline{SRj+2}$, and then output a signal Saj as a logical product of the two signals SRj+1 and $\overline{SRj+2}$.

In order to shift the source driver from right to left, the clocked inverter 5_jf_ outputs an inversion signal $\overline{SRj}$ of the signal SRj to the AND gate 5_jd_. As a result, the AND gate 5_jd_ receives the signals SRj+1 and $\overline{SRj}$, and then output a signal Saj as a logical product of the two signals SRj+1 and $\overline{SRj}$.

The output signals Saj obtained in this manner is inputted to the corresponding sampling analog switch 2_j_ formed of an NMOS device. Then, the sampling analog switch 2_j_ is controlled to be ON or OFF. When being on, the sampling analog switch 2_j_ is turned conductive, thereby charging the sampling capacitor 4_j_ connected thereto until the sampling capacitor 4_j_ obtains a voltage of the video signal Video. Thereafter, the sampling capacitor 4_j_ keeps the level of the voltage of the video signal Video obtained when the corresponding sampling analog switch 2_j_ is switched OFF. The voltage held in this manner is used as an input signal to the data signal line _Sj_ of, for example, a liquid crystal display apparatus.

Figure 11:
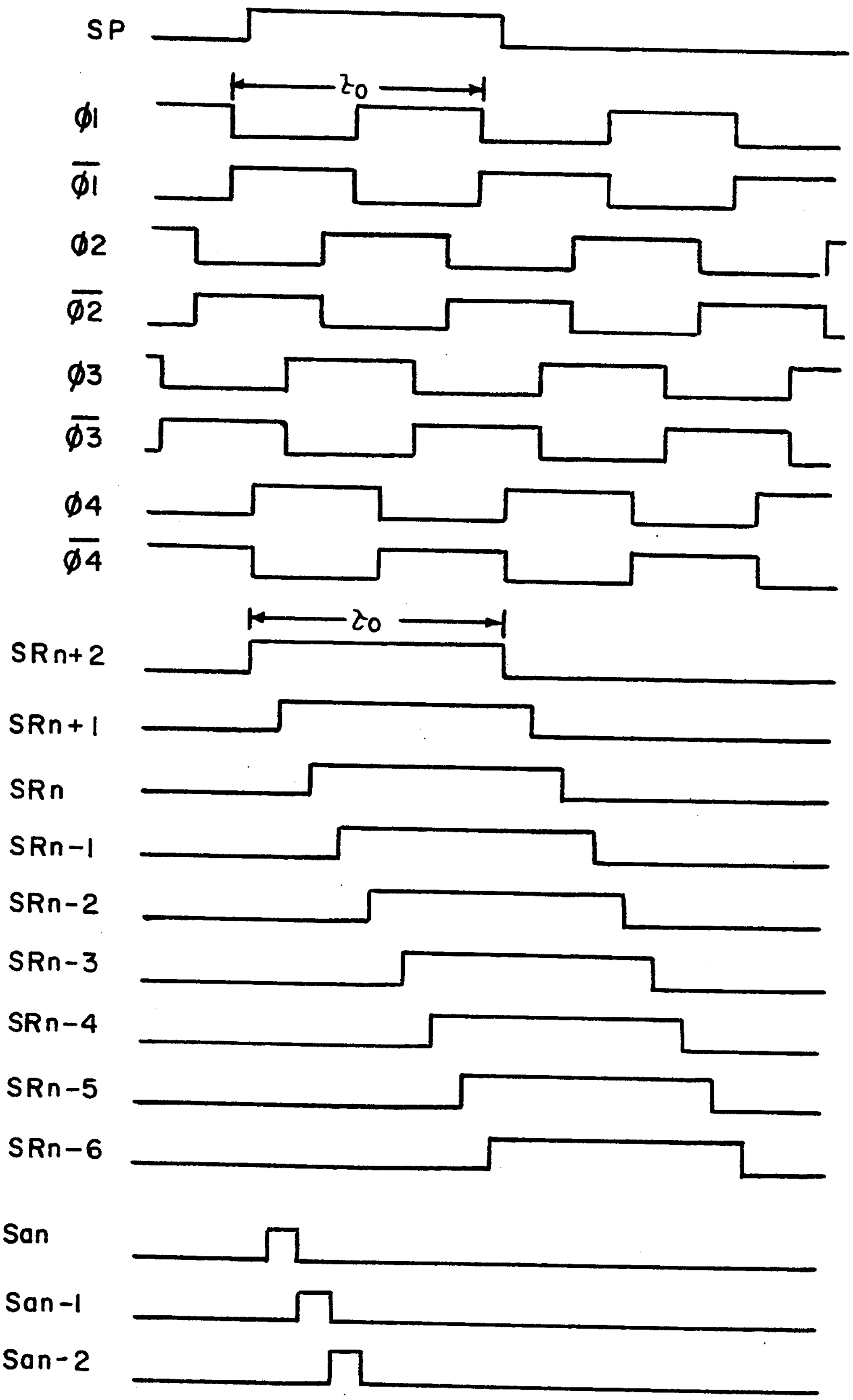
FIG. 11 is a time chart illustrating the operation of the source driver shown in FIG. 9.

In the source driver operated in the abovementioned manner, the signals Sa1 to San for controlling the sampling analog switches 21 to 2_n_ each have a pulse width of $\frac{1}{2}\tau 0$ due to the control signal generating circuits 51 to 5_n_ as is shown in FIGS. 10 and 11. Accordingly, two or more sampling analog switches are never conductive simultaneously, and thus the video signal line 30 is always loaded with a capacitance of only one sampling capacitor. For this reason, the RC time constant is $\frac{1}{2}$ of that in the conventional source driver, thereby remarkably reducing the distortion of the waveform of the video signal Video caused by the RC integrating circuit. As a result, an image having a high horizontal resolution can be obtained.

In the control signal generating circuits 51 to 5_n_, one output signals SRj among the output signals SR1 to SRn from the shift registers 11 to 14 is combined with another such output signal SRj+1 for the shift from left to right and another such output signal SRj−1 for the shift from right to left to produce a logical product. The output signal to be combined with SRj may be the inversion signal of any signal which is at the ON level simultaneously with output signal SRj. For example, the output signals SRj and SRj+2 may be combined for the shift from left to right, and the output signals SRj and SRj−2 may be combined for the shift from right to left. In the case where the output signals SRj and SRj+2 are combined, two sampling analog switches 2_j_ and 2_j_ +1 are constantly conductive simultaneously. In the case where the output signals SRj and SRj−2 are combined, two sampling analog switches 2_j_ and 2_j −1_ are constantly conductive simultaneously. However, the number of the sampling analog switches which are simultaneously conductive is much smaller than that in the conventional source driver. Accordingly, an image having a high horizontal resolution can be obtained.

In the second and the third examples, the AND gates 51_d_ to 5_nd_ may be replaced with any other elements as long as a logical product can be obtained. For example, NOR gates may be used instead of the AND gates. The present invention is applicable to a source drive having shift registers in any number of two or more.

According to the present invention, a driving circuit, for use especially in a driver monolithic liquid crystal display apparatus, for reducing the operating speed of the shift registers by using a plurality of shift registers while realizing an image having a high horizontal resolution without distorting the waveform of a video signal is obtained.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A driving circuit for use in a display apparatus for transmitting a video signal to data lines, comprising:

a plurality of shift registers for sequentially outputting signals so that high periods thereof in which the signals are high are partially overlapped sequentially;

control signal generating means for outputting a control signal which is at the ON level during a period shorter than a pulse width of the signals outputted by the shift registers;

switching means controlled to be in one of an ON state and an OFF state based on the control signal; and a sampling capacitor for receiving the video signal through the switching means and for holding the video signal by the control of the switching means to be in one of the ON state and the OFF state, the video signal held by the sampling capacitor being transmitted to the data lines.

2. A driving circuit for use in a display apparatus according to claim 1, wherein the control signal is at the ON level during a period in which a pair of the signals outputted by the shift registers having the high periods partially overlapped with each other are both high.

3. A driving circuit for use in a display apparatus according to claim 2, wherein the control signal generating means includes:

NAND gate means for obtaining a NAND signal of the pair of the signals and for outputting the NAND signal as an output; and inverter means for inverting the output from the NAND gate means.

4. A driving circuit for use in a display apparatus according to claim 3, wherein the switching means includes a CMOS device which has an NMOS device having a gate receiving an output from the inverter means and a PMOS device having a gate receiving an output from the NAND gate means.

5. A driving circuit for use in a display apparatus according to claim 1, wherein the control signal is at the ON level during a period in which an inversion signal obtained by inverting either one of a pair of the signals outputted by the shift registers having the high periods partially overlapped with each other and the other signal of the pair of the signals are both high.

6. A driving circuit for use in a display apparatus according to claim 5, wherein the control signal generating means includes:

inverter means for inverting either one of the pair of the signals and outputting the inversion signal; and AND gate means for obtaining an AND signal of the inversion signal and the other signal and outputting the AND signal.

7. A driving circuit for use in a display apparatus according to claim 1, wherein the shift registers are bidirectionally shifting.

8. A driving circuit for use in a display apparatus according to claim 1, wherein the shift registers are provided in at least one group of four.

* * * * *